(12) United States Patent
Hiraoka et al.

(10) Patent No.: US 12,161,000 B2
(45) Date of Patent: Dec. 3, 2024

(54) SOLAR CELL AND PHOTOELECTRIC CONVERSION ELEMENT

(71) Applicant: Panasonic Intellectual Property Management Co., Ltd., Osaka (JP)

(72) Inventors: Maki Hiraoka, Nara (JP); Takeyuki Sekimoto, Osaka (JP); Teruaki Yamamoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 58 days.

(21) Appl. No.: 18/062,569

(22) Filed: Dec. 6, 2022

(65) Prior Publication Data

US 2023/0096903 A1    Mar. 30, 2023

Related U.S. Application Data

(63) Continuation of application No. PCT/JP2021/022954, filed on Jun. 16, 2021.

(30) Foreign Application Priority Data

Jul. 6, 2020  (JP) .................................. 2020-116725

(51) Int. Cl.
*H10K 30/15* (2023.01)
*H10K 30/82* (2023.01)
*H10K 102/10* (2023.01)

(52) U.S. Cl.
CPC .......... *H10K 30/151* (2023.02); *H10K 30/82* (2023.02); *H10K 2102/102* (2023.02); *H10K 2102/103* (2023.02)

(58) Field of Classification Search
CPC ................. H10K 30/151; H10K 30/82; H10K 2102/102; H10K 2102/103; H10K 39/32;
(Continued)

(56) References Cited

U.S. PATENT DOCUMENTS

2016/0149149 A1   5/2016  Shinotsuka et al.
2018/0019360 A1   1/2018  Mishima et al.
(Continued)

FOREIGN PATENT DOCUMENTS

| JP | 2020-013982 | 1/2020 |
|----|-------------|--------|
| WO | 2014/208713 | 12/2014 |
| WO | 2016/157979 | 10/2016 |

OTHER PUBLICATIONS

Colón ("Influence of residual carbon on the photocatalytic activity of TiO2/C samples for phenol oxidation") Applied Catalysis B: Environmental 43 (2003) 163-173 (Year: 2003).*
(Continued)

*Primary Examiner* — Angelo Trivisonno
(74) *Attorney, Agent, or Firm* — Greenblum & Bernstein, P.L.C.

(57) ABSTRACT

A solar cell includes a first electrode, a first electron transport layer, a second electron transport layer, a photoelectric conversion layer, and a second electrode. The photoelectric conversion layer is disposed between the first electrode and the second electrode. The first electron transport layer is disposed between the photoelectric conversion layer and the first electrode. The second electron transport layer is disposed between the first electron transport layer and the first electrode. The first electron transport layer includes carbon and a porous electron transport material.

8 Claims, 9 Drawing Sheets

(58) Field of Classification Search
CPC ........ H10K 30/85; H10K 39/15; H10K 85/20; H10K 85/50; Y02E 10/542; Y02E 10/549; H01L 31/0236

See application file for complete search history.

(56) References Cited

U.S. PATENT DOCUMENTS

| | | | |
|---|---|---|---|
| 2020/0020820 A1* | 1/2020 | Yokoyama | H10K 30/80 |
| 2020/0212243 A1 | 7/2020 | Kim et al. | |

OTHER PUBLICATIONS

International Search Report of PCT application No. PCT/JP2021/022954 dated Aug. 3, 2021.

Julian Burschka et al., "Sequential deposition as a route to high-performance perovskite-sensitized solar cells", Nature, vol. 499, Jul. 18, 2013, pp. 316-319.

Taisuke Matsui et al., "Room-Temperature Formation of Highly Crystalline Multication Perovskites for Efficient, Low-Cost Solar Cells", Advanced Materials, vol. 29, Jan. 20, 2017, 1606258.

Qingfeng Dong et al., "Electron-hole diffusion lengths > 175µm in solution-grown CH3NH3PbI3 single crystals", Science, vol. 347, Issue 6225, Jan. 29, 2015, pp. 967-970.

Extended European Search Report (EESR) from European Patent Office (EPO) dated Nov. 30, 2023 for the related European Patent Application No. EP21837906.3.

Domanski Konrad et al: "Not All That Glitters Is Gold: Metal-Migration-Induced Degradation in Perovskite Solar Cells", ACS Nano, vol. 10, No. 6, May 20, 2016 (May 20, 2016), pp. 6306-6314, XP093102919.

Domanski Konrad et al: "Supplementary Information: Not All That Glitters Is Gold: Metal-Migration-Induced Degradation in Perovskite Solar Cells", ACS Nano, vol. 10, No. 6, May 20, 2016 (May 20, 2016), pp. 6306-6314, XP93102994.

Nam Jiyoon et al: "Facile Interfacial Engineering of Mesoporous TiO2 for Low-Temperature Processed Perovskite Solar Cells", Nanomaterials, vol. 9, No. 9, Aug. 29, 2019 (Aug. 29, 2019), p. 1220, XP093103037.

Jiangzhao Chen et al: "FA0.88Cs0.12PbI3-x(PF6)x Interlayer Formed by Ion Exchange Reaction between Perovskite and Hole Transporting Layer for Improving Photovoltaic Performance and Stability", Advanced Materials, VCH Publishers, DE, vol. 30, No. 40, Aug. 23, 2018 (Aug. 23, 2018), page n/a, XP071872375.

Pescetelli S et al: "Graphene and Related 2D Materials: A Winning Strategy for Enhanced Efficiency and Stability in Perovskite Photovoltaics", 2018 IEEE 4th International Forum on Research and Technology for Society and Industry (RTSI), IEEE, Sep. 10, 2018 (Sep. 10, 2018), pp. 1-4, XP033458971.

\* cited by examiner

SOLAR CELL AND PHOTOELECTRIC CONVERSION ELEMENT

BACKGROUND

1. Technical Field

The present disclosure relates to a solar cell and a photoelectric conversion element.

2. Description of the Related Art

In recent years, research and development is well underway on organic thin-film solar cells or perovskite solar cells as new solar cells that will replace the existing silicon solar cells.

A perovskite solar cell uses a perovskite compound represented by the chemical formula $ABX_3$ (where A is a monovalent cation, B is a divalent cation, and X is a halogen anion) as a photoelectric conversion material.

Julian Burschka et al., "Sequential deposition as a route to high-performance perovskite-sensitized solar cells", Nature, vol. 499, pp. 316-319, 18 Jul. 2013 [DOI: 10.1038/nature 12340] discloses a perovskite solar cell in which a perovskite compound represented by the chemical formula $CH_3NH_3PbI_3$ (hereinafter, written as "$MAPbI_3$") is used as a photoelectric conversion material in the perovskite solar cell. In the perovskite solar cell disclosed in this literature, the perovskite compound represented by $MAPbI_3$, $TiO_2$ and spiro-OMeTAD are used as a photoelectric conversion material, an electron transport material, and a hole transport material, respectively.

Taisuke Matsui et al., "Room-Temperature Formation of Highly Crystalline Multication Perovskites for Efficient, Low-Cost Solar Cells", Advanced Materials, Volume 29, Issue 15, Apr. 18, 2017, 1606258 [DOI: 10.1002/adma. 201606258] discloses a perovskite solar cell that uses, as a photoelectric conversion material in the perovskite solar cell, a multication perovskite compound that has monovalent cations including $CH_3NH_3^+$ (hereinafter, written as "MA"), $CH(NH_2)_2^+$ (hereinafter, written as "FA"), and Cs. In the perovskite solar cell disclosed in this literature, the multication perovskite compound, $TiO_2$, and spiro-OMeTAD are used as a photoelectric conversion material, an electron transport material, and a hole transport material, respectively.

WO 2014/208713 discloses an organic thin-film solar cell. The organic thin-film solar cell disclosed in WO 2014/208713 has an uneven microstructure at the interface between a photoelectric conversion layer and an electrode. By virtue of having this configuration, the organic thin-film solar cell disclosed in WO 2014/208713 can attain an enhancement in photoelectric energy conversion efficiency.

SUMMARY

One non-limiting and exemplary embodiment provides a solar cell having an enhanced fixation force of an electron transport layer.

In one general aspect, the techniques disclosed here feature a solar cell including a first electrode, a first electron transport layer, a second electron transport layer, a photoelectric conversion layer, and a second electrode, wherein the photoelectric conversion layer is disposed between the first electrode and the second electrode, the first electron transport layer is disposed between the photoelectric conversion layer and the first electrode, the second electron transport layer is disposed between the first electron transport layer and the first electrode, and the first electron transport layer includes carbon and a porous electron transport material.

The solar cell provided according to the present disclosure attains an enhanced fixation force of the electron transport layer.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

Definition of Terms

Figure 1:
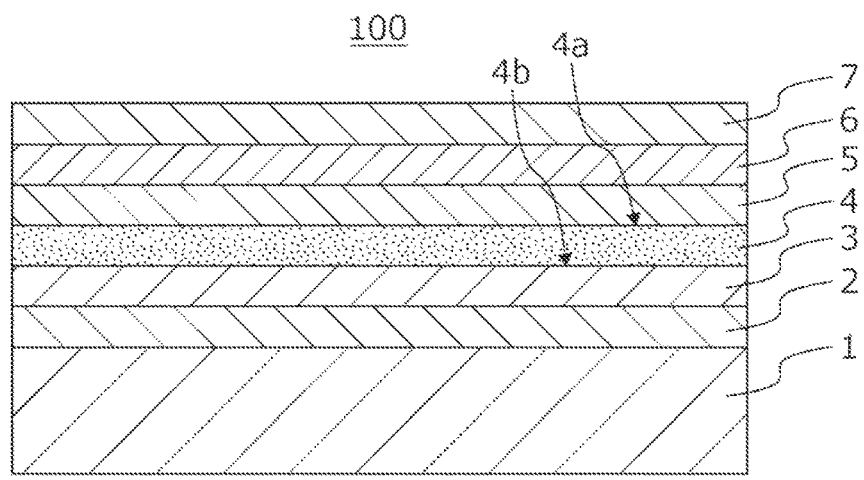
FIG. 1 illustrates a sectional view of a solar cell 100 according to the first embodiment.

As used in the present specification, the term "perovskite compound" means a perovskite crystal structure represented by the chemical formula $ABX_3$ (where A is a monovalent cation, B is a divalent cation, and X is a halogen anion), or a structure having a crystal similar thereto.

As used in the present specification, the term "perovskite solar cell" means a solar cell that includes a perovskite compound as a photoelectric conversion material.

<Underlying Knowledge Forming Basis of the Present Disclosure>

The underlying knowledge forming the basis of the present disclosure will be described below.

As disclosed in Qingfeng Dong et al., Science, 2015, 347, 6225, 967-970, a perovskite compound has characteristic properties represented by a high light absorption coefficient and a long diffusion length. When the thickness is several hundreds of nanometers, these properties allow a perovskite solar cell to generate electricity with high efficiency. Furthermore, a perovskite solar cell is characterized by, for example, using less materials than an existing silicon solar cell, being free from high-temperature processing, and being producible by a coating process. Due to these characteristics, a perovskite solar cell is lightweight and can be formed even on a substrate made of a flexible material such as a plastic. Thus, perovskite solar cells can be installed at locations heretofore impossible due to weight limits. For example, a perovskite solar cell can be combined with an existing member such as, for example, a building material. That is, perovskite solar cells can extend their use to building material-integrated solar cells. When, for example, a perovskite solar cell is combined with a building material as described above, it is necessary that, for example, the perovskite solar cell be formed on a substrate that is a member having a relatively largely uneven structure on the surface.

Furthermore, a higher photoelectric conversion efficiency is sought for through studies on stacked solar cells or tandem solar cells in which a perovskite solar cell and a silicon solar cell are stacked together. In order to make effective use of incoming light, a silicon solar cell often has a textured structure having irregularities on the surface. When a silicon solar cell has a textured structure, a perovskite solar cell needs to be formed on the irregular surface without separation.

If separation occurs during a coating process for forming a film in a perovskite solar cell, the portion of the base at the location where the separation has occurred is caused to extend through the perovskite solar cell and will short-circuit with an upper electrode to cause a decrease in power generation efficiency. As a result, the solar cell may fail to function as expected. The present inventors have tracked down that if separation occurs in a solvophilic porous electron transport layer during the production of a perovskite solar cell, no capillary force acts on a solution for a photoelectric conversion layer in the subsequent step, and the photoelectric conversion layer that is formed may have a gap.

In the case of, for example, a tandem solar cell, the film thickness of a perovskite solar cell is small compared to the average height of irregularities on the textured structure. Furthermore, films are formed by a coating process. Thus, weak fixation on the uneven structure leads to an exposure of a protrudent top portion of the base, and results in insufficient formation of the perovskite solar cell over the entire surface. That is, the perovskite solar cell has a gap on the top portion, and the base extends through the perovskite solar cell and short-circuits with the upper electrode. As a result, the perovskite solar cell does not function as expected.

In view of these findings, the present inventors have developed a structure based on which a perovskite solar cell can be fabricated while ensuring that a solvophilic porous electron transport layer will be present without separation over the entirety of a region where a solution needs to be fixed until the completion of the fabrication of the perovskite solar cell, such as on the surface of an uneven structure or the surface of a three-dimensional structure, and the entire surface of the electron transport layer will be covered by a photoelectric conversion layer without any gaps. Furthermore, the present inventors have found that the structure described above can offer enhanced photoelectric conversion efficiency also when the solar cell is formed on a flat surface.

Embodiments of the Present Disclosure

Hereinbelow, embodiments of the present disclosure will be described in detail with reference to the drawings.

First Embodiment

FIG. 1 illustrates a sectional view of a solar cell 100 according to the first embodiment.

As illustrated in FIG. 1, the solar cell 100 according to the first embodiment includes a substrate 1, a first electrode 2, a second electron transport layer 3, a first electron transport layer 4, a photoelectric conversion layer 5, a hole transport layer 6, and a second electrode 7. Specifically, the substrate 1, the first electrode 2, the second electron transport layer 3, the first electron transport layer 4, the photoelectric conversion layer 5, the hole transport layer 6, and the second electrode 7 are disposed in this order. The first electron transport layer 4 has a first main surface 4a (specifically, a first main surface facing the photoelectric conversion layer 5) and a second main surface 4b (specifically, a second main surface facing the second electron transport layer 3).

The first electron transport layer 4 includes carbon and a porous electron transport material.

In the solar cell 100, the first electron transport layer 4 exhibits a high fixation force because of its containing carbon. As a result, the first electron transport layer is resistant to separation due to a nonuniform flow of a solution in coating and drying steps, and thus the photoelectric conversion layer can be formed thereon while preventing gaps.

A layer having another function may be provided between the substrate 1 and the first electrode 2, between the first electrode 2 and the second electron transport layer 3, between the photoelectric conversion layer 5 and the hole transport layer 6, or between the hole transport layer 6 and the second electrode 7.

For example, the "layer having another function" may be a functional layer that suppresses the recombination of charges at the interface.

The first electrode 2 may have an uneven structure.

Figure 2:
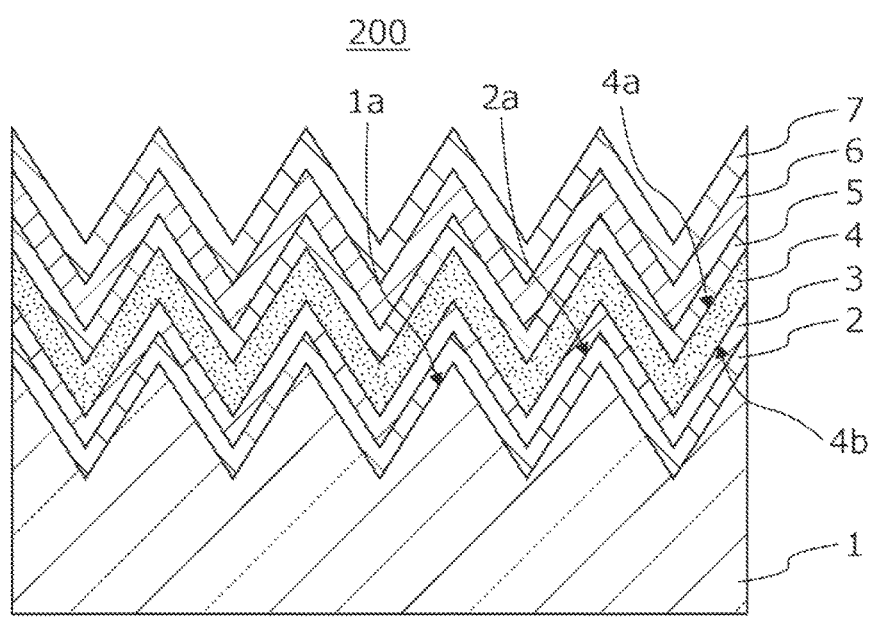
FIG. 2 illustrates a sectional view of a solar cell 200 according to the first embodiment.

FIG. 2 illustrates a sectional view of a solar cell 200 according to the first embodiment.

As illustrated in FIG. 2, the solar cell 200 according to the first embodiment includes a substrate 1, a first electrode 2, a second electron transport layer 3, a first electron transport layer 4, a photoelectric conversion layer 5, a hole transport layer 6, and a second electrode 7. Specifically, the substrate 1, the first electrode 2, the second electron transport layer 3, the first electron transport layer 4, the photoelectric conversion layer 5, the hole transport layer 6, and the second electrode 7 are disposed in this order. The first electron transport layer 4 has a first main surface 4a (specifically, a first main surface facing the photoelectric conversion layer 5) and a second main surface 4b (specifically, a second main surface facing the second electron transport layer 3).

The first electrode 2 has a first main surface 2a facing the second electron transport layer 3. The first main surface 2a has an uneven structure. The second electron transport layer 3, the first electron transport layer 4, the photoelectric conversion layer 5, the hole transport layer 6, and the second electrode 7 disposed on the first main surface 2a of the first electrode 2 each have an uneven structure that reflects the uneven structure of the underlying first main surface 2a. In the solar cell 200, the first electrode 2 is disposed on a first main surface 1a of the substrate 1. The first main surface 1a of the substrate 1 has an uneven structure. That is, the uneven structure of the first main surface 2a of the first electrode 2 is a reflection of the uneven structure of the first main surface 1a of the underlying substrate 1.

Here, in the present specification, the "uneven structure" is surface irregularities that are observed in a sectional image with a scanning transmission electron microscope and in which the average of the height differences between a top portion and a valley portion is more than 0.1 µm.

Figure 3A:
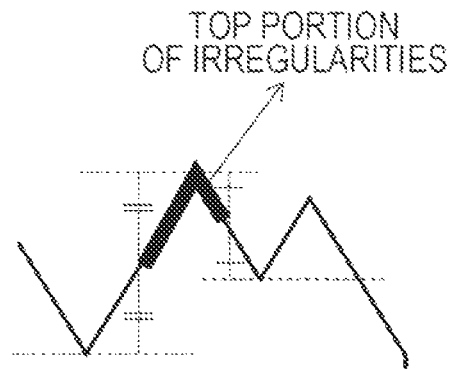
FIG. 3A is a view illustrating a top portion of an uneven structure in the solar cell 200 according to the first embodiment.
Figure 3B:
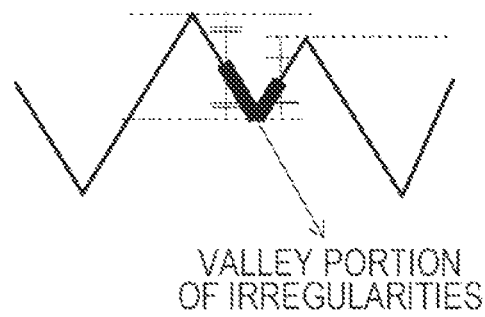
FIG. 3B is a view illustrating a valley portion of the uneven structure in the solar cell 200 according to the first embodiment.
Figure 3C:
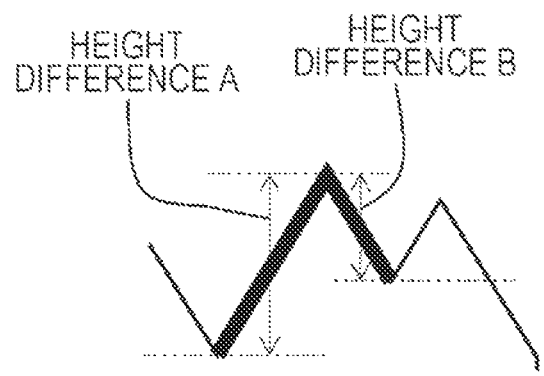
FIG. 3C is a view illustrating height differences in irregularities of the uneven structure in the solar cell 200 according to the first embodiment.

The "top portion" and the "valley portion" of the uneven structure in the present specification will be described. FIG. 3A is a view illustrating a top portion of the uneven structure in the solar cell 200 according to the first embodiment. FIG. 3B is a view illustrating a valley portion of the uneven structure in the solar cell 200 according to the first embodiment. FIG. 3C is a view illustrating height differences in irregularities of the uneven structure in the solar cell 200 according to the first embodiment. As illustrated in FIG. 3A, the top portion indicates the apex of the protrudent shape in the uneven structure, and peripheral portions around the apex. The peripheral portions around the apex are, for example, regions that each include an upper half of the height from the apex to the bottom of the adjacent recessed shape. As illustrated in FIG. 3B, the valley portion indicates the bottom of the recessed shape in the uneven structure, and peripheral portions around the bottom. The peripheral portions around the bottom of the recessed shape are, for example, regions that each include a lower half of the height from the bottom of the recessed shape to the apex of the adjacent protrudent shape. As illustrated in FIG. 3C, the height difference in the uneven structure is the height from the apex of the top portion of the uneven structure to the bottom of the valley portion, and is variable from place to place (such as, for example, the height difference A and the height difference B in the drawing). The uneven structure is distinguished by the average of the height differences in the uneven structure. Here, the average of the height differences between a top portion and a valley portion is determined as follows. First, a 20 µm long region is arbitrarily extracted from a sectional image obtained with a scanning transmission electron microscope. Next, the height difference between a top portion and a valley portion adjacent to each other is measured with respect to all the surface irregularities in the region. The measured values thus obtained are averaged to give the average height difference. The average of the height differences between a top portion and a valley portion is determined in the manner described above.

In the solar cell 200, the average of the height differences between a top portion and a valley portion of the uneven structure of the first electrode 2 may be greater than or equal to 0.5 µm and less than or equal to 3 µm.

Hereinbelow, the layers will be described in detail with reference to FIG. 2.

(Substrate 1)

The substrate 1 supports the layers constituting the solar cell 200. As illustrated in FIG. 2, the substrate 1 may have an uneven structure on the first main surface 1a facing the first electrode 2. The substrate 1 may be formed of a transparent material. Examples of the substrates 1 include glass substrates and plastic substrates. The plastic substrate may be a plastic film. When the first electrode 2 has a strength enough to support the layers, the solar cell 200 may be free from the substrate 1.

(First Electrode 2)

The first electrode 2 has conductivity. As described hereinabove, the first main surface 2a of the first electrode 2 may have an uneven structure.

The solar cell 200 includes the second electron transport layer 3 and the first electron transport layer 4 between the first electrode 2 and the photoelectric conversion layer 5. Thus, the first electrode 2 does not necessarily have characteristics that block holes moving from the photoelectric conversion layer 5. The first electrode 2 may be composed of a material capable of forming an ohmic contact with the photoelectric conversion layer 5.

The first electrode 2 may or may not have translucency. At least one selected from the group consisting of the first electrode 2 and the second electrode 7 has translucency. For example, the first electrode 2 transmits light in the visible to near infrared region.

For example, the first electrode 2 may be composed of a transparent and conductive material. For example, such a material may be at least one selected from the group consisting of metal oxides and metal nitrides. Examples of such materials include:

(i) titanium oxides doped with at least one selected from the group consisting of lithium, magnesium, niobium, and fluorine;
(ii) gallium oxides doped with at least one selected from the group consisting of tin, and silicon;
(iii) gallium nitrides doped with at least one selected from the group consisting of silicon, and oxygen;

(iv) indium-tin composite oxides;
(v) tin oxides doped with at least one selected from the group consisting of antimony, and fluorine;
(vi) zinc oxides doped with at least one selected from the group consisting of boron, aluminum, gallium, and indium; and
(vii) composites of the above materials.

The first electrode 2 may be an electrode that is composed of a nontransparent material and has a patterned shape through which light can be transmitted. Examples of the light-transmitting patterned shapes include linear patterns, wavy patterns, grid patterns, and punching metal-like patterns in which a large number of micro through-holes are regularly or irregularly arranged. When the first electrode 2 has such a patterned shape, light can be transmitted through regions of the electrode where there is no electrode material. Examples of the nontransparent materials include platinum, gold, silver, copper, aluminum, rhodium, indium, titanium, iron, nickel, tin, zinc, and alloys containing any of these metals. The material may be a conductive carbon material.

For example, the light transmittance of the first electrode 2 may be greater than or equal to 50%, or may be greater than or equal to 80%. The wavelength of light transmitted through the first electrode 2 depends on the absorption wavelength of the photoelectric conversion layer 5. For example, the first electrode 2 may have a thickness of greater than or equal to 1 nm and less than or equal to 1000 nm.

(Second Electron Transport Layer 3)

The second electron transport layer 3 includes a semiconductor. The second electron transport layer 3 may be formed of a semiconductor having a bandgap of greater than or equal to 3.0 eV. By forming the second electron transport layer 3 with a semiconductor having a bandgap of greater than or equal to 3.0 eV, visible light and infrared light can be transmitted to the photoelectric conversion layer 5. Examples of the semiconductors include organic or inorganic n-type semiconductors.

Examples of the organic n-type semiconductors include imide compounds, quinone compounds, fullerenes, and fullerene derivatives. Examples of the inorganic n-type semiconductors include metal element oxides, metal element nitrides, and perovskite-type oxides. Examples of the metal element oxides that may be used include oxides of Cd, Zn, In, Pb, Mo, W, Sb, Bi, Cu, Hg, Ti, Ag, Mn, Fe, V, Sn, Zr, Sr, Ga, Si, and Cr. More specific examples include $TiO_2$. Examples of the metal element nitrides include GaN. Examples of the perovskite-type oxides include $SrTiO_3$ and $CaTiO_3$.

The second electron transport layer 3 may be formed of a material having a bandgap of greater than 6.0 eV. Examples of the materials having a bandgap of greater than 6.0 eV include:
(i) halides of alkali metals or alkaline earth metals, such as lithium fluoride and barium fluoride;
(ii) oxides of alkaline earth metals, such as magnesium oxide; and
(iii) silicon dioxide. In this case, the thickness of the second electron transport layer 3 may be, for example, less than or equal to 10 nm in order to ensure electron transport properties of the second electron transport layer 3.

The second electron transport layer 3 may include a plurality of layers made of different materials from one another.

(First Electron Transport Layer 4)

The first electron transport layer 4 includes a porous electron transport material. Hereinbelow, the porous electron transport material will be written as a porous body. The first electron transport layer 4 may be composed of a porous body.

The porous body contains pores. The pores are continuous from the second main surface 4b of the first electron transport layer 4 in contact with the second electron transport layer 3 to the first main surface 4a of the first electron transport layer 4 in contact with the photoelectric conversion layer 5. Typically, the pores are filled with the material forming the photoelectric conversion layer 5, and electrons can move directly from the photoelectric conversion layer 5 to the second electron transport layer 3.

For example, the porous body is composed of particles of an insulator or a semiconductor that are connected to one another. Examples of the insulator particles include aluminum oxide particles and silicon oxide particles. Examples of the semiconductor particles include inorganic semiconductor particles. Examples of the inorganic semiconductors include metal element oxides, metal element perovskite oxides, metal element sulfides, and metal chalcogenides. Examples of the metal element oxides include oxides of metal element Cd, Zn, In, Pb, Mo, W, Sb, Bi, Cu, Hg, Ti, Ag, Mn, Fe, V, Sn, Zr, Sr, Ga, Si, or Cr. Specific examples of the metal element oxides include $TiO_2$. Examples of the metal element perovskite oxides include $SrTiO_3$ and $CaTiO_3$. Examples of the metal element sulfides include CdS, ZnS, $In_2S_3$, PbS, $Mo_2S$, $WS_2$, $Sb_2S_3$, $Bi_2S_3$, $ZnCdS_2$, and $Cu_2S$. Examples of the metal chalcogenides include CdSe, $In_2Se_3$, $WSe_2$, HgS, PbSe, and CdTe.

The first electron transport layer 4 includes carbon. Carbon is contained as an element constituting the first electron transport layer 4.

For example, the carbon contained in the first electron transport layer 4 may be carbon originating from a binder used in the formation of the porous body. For example, the binder may be a dispersant such as a surfactant that has been attached to the surface of the particles used for the formation of the porous body, or may be an organic compound used for the purpose of strengthening the bond of the porous body and the underlying layer (for example, the second electron transport layer 3). The porous body may serve as a base for the formation of the photoelectric conversion layer 5. By containing a binder, the porous body can be strongly bonded even to the protrudent top portions of the surface having an uneven structure. As a result, the porous body allows the photoelectric conversion layer 5 to be formed thereon by a coating process while ensuring that the photoelectric conversion layer 5 will be formed over the surface having an uneven structure.

In the first electron transport layer 4, the ratio of the second carbon intensity according to time-of-flight secondary ion mass spectrometry on the second main surface 4b to the first carbon intensity according to time-of-flight secondary ion mass spectrometry on the first main surface 4a (that is, second carbon intensity/first carbon intensity) may be greater than or equal to 0.41 and less than or equal to 1.07. Hereinbelow, the "time-of-flight secondary ion mass spectrometry" is written as "TOF-SIMS". In the first electron transport layer 4, a sufficient amount of carbon is present on the second main surface 2b so that the second carbon intensity/first carbon intensity ratio satisfies the above range. As a result, the first electron transport layer 4 attains an increased fixation force and the first electron transport layer 4 does not separate from the base, allowing the photoelectric conversion layer 5 to be formed by a coating process while ensuring that the photoelectric conversion layer 5 will cover the entire surface of the base with a substantially uniform film thickness. As a result, the solar cell that is obtained is highly reliable and has a low risk of problems such as a short circuit between the base and the upper electrode.

In order to further enhance the fixation force of the first electron transport layer 4, the above carbon intensity ratio may be greater than or equal to 0.49 and less than or equal to 0.90.

The thickness of the first electron transport layer 4 may be greater than or equal to 0.01 μm and less than or equal to 10 μm, may be greater than or equal to 0.01 μm and less than or equal to 1 μm, or may be greater than or equal to 0.01 μm and less than or equal to 0.2 μm. For example, the thickness of the first electron transport layer 4 is larger than the thickness of the second electron transport layer 3. The first electron transport layer 4 may have a large surface roughness. Specifically, the surface roughness coefficient of the first electron transport layer 4 given by the value of effective area/projected area may be greater than or equal to 10, or may be greater than or equal to 100. The projected area is the area of a shadow formed behind an object when the object is illuminated with light from the front. The effective area is the actual surface area of an object. The effective area may be calculated from the volume determined from the projected area and the thickness of an object, and the specific surface area and the bulk density of the material or materials forming the object.

(Photoelectric Conversion Layer 5)

The photoelectric conversion layer 5 contains a perovskite compound. Specifically, the photoelectric conversion layer 5 contains, as a photoelectric conversion material, a perovskite compound composed of a monovalent cation, a divalent cation, and a halogen anion. The photoelectric conversion material is a light-absorbing material.

In the present embodiment, the perovskite compound may be a compound represented by the chemical formula $ABX_3$ (where A is a monovalent cation, B is a divalent cation, and X is a halogen anion).

In line with the commonly used expressions for perovskite compounds, A, B and X in the present specification are also written as A-site, B-site and X-site, respectively.

In the present embodiment, the perovskite compound may have a perovskite-type crystal structure represented by the chemical formula $ABX_3$. As an example, a monovalent cation is located at the A-site, a divalent cation at the B-site, and a halogen anion at the X-site.

(A-site)

The monovalent cation located at the A-site is not limited. Examples of the monovalent cations include organic cations and alkali metal cations. Examples of the organic cations include methylammonium cation (namely, $CH_3NH_3^+$), formamidinium cation (namely, $NH_2CHNH_2^+$), phenylethylammonium cation (namely, $C_6H_5C_2H_4NH_3^+$), and guanidinium cation (namely, $CH_6N_3^+$). Examples of the alkali metal cations include cesium cation (namely, $Cs^+$).

To realize high photoelectric conversion efficiency, for example, the A-site may include at least one selected from the group consisting of $Cs^+$, formamidinium cation and methylammonium cation.

The cation at the A-site may be a mixture of the organic cations described above. The cation at the A-site may be a mixture of at least one of the organic cations described above, and at least one metal cation.

(B-site)

The divalent cation located at the B-site is not limited. Examples of the divalent cations include divalent cations of Group 13 to Group 15 elements. For example, the B-site may include a Pb cation, namely, $Pb^{2+}$, or a Sn cation, namely, $Sn^{2+}$.

(X-site)

The halogen anion located at the X-site is not limited.

The respective elements located at the A-site, the B-site and the X-site, that is, the respective ions may be each a single kind of element, or a plurality of kinds of elements.

The photoelectric conversion layer 5 may include a material other than photoelectric conversion materials. For example, the photoelectric conversion layer 5 may further include a quencher material for reducing the defect density of the perovskite compound. The quencher material may be a fluorine compound such as tin fluoride. The molar ratio of the quencher material to the photoelectric conversion material may be greater than or equal to 5% and less than or equal to 20%.

The photoelectric conversion layer 5 may principally include a perovskite compound composed of a monovalent cation, a divalent cation, and a halogen anion.

The phrase "the photoelectric conversion layer 5 principally includes a perovskite compound composed of a monovalent cation, a divalent cation, and a halogen anion" means that the photoelectric conversion layer 5 contains greater than or equal to 70 mass % (desirably greater than or equal to 80 mass %) of a perovskite compound composed of a monovalent cation, a divalent cation, and a halogen anion.

The photoelectric conversion layer 5 may contain impurities. The photoelectric conversion layer 5 may further contain a compound other than the perovskite compound described above.

The photoelectric conversion layer 5 may have a thickness of greater than or equal to 50 nm and less than or equal to 10 μm. The thickness of the photoelectric conversion layer 5 may depend on the magnitude of light absorption of the photoelectric conversion layer 5. A portion of the material of the photoelectric conversion layer 5 is present inside the pores of the porous body of the first electron transport layer 4. That is, part of the photoelectric conversion layer 5 is mixed in the first electron transport layer 4. Thus, the thickness of the photoelectric conversion layer 5 is measured so as to include the photoelectric conversion material present in the pores of the porous body of the first electron transport layer 4, and the thickness that is measured includes, for example, the thickness of the first electron transport layer 4.

The perovskite layer present in the photoelectric conversion layer 5 may be formed by a method such as a solution coating method or a codeposition method.

The photoelectric conversion layer 5 may have an uneven structure. When the photoelectric conversion layer 5 is formed on the first main surface 4a of the first electron transport layer 4, the uneven structure of the photoelectric conversion layer 5 may be the result of following the profile of the uneven structure of the first main surface 4a of the first electron transport layer 4.

(Hole Transport Layer 6)

The hole transport layer 6 contains a hole transport material. The hole transport material is a material that transports holes. Examples of the hole transport materials include organic materials and inorganic semiconductors.

Typical examples of the organic materials used as the hole transport materials include 2,2',7,7'-tetrakis-(N,N-di-p-methoxyphenylamine) 9,9'-spirobifluorene (hereinafter, written as "spiro-OMeTAD"), poly[bis(4-phenyl)(2,4,6-trimethylphenyl)amine] (hereinafter, written as "PTAA"), poly(3-hexylthiophene-2,5-diyl) (hereinafter, written as "P3HT"), poly(3,4-ethylenedioxythiophene) polystyrene sulfonate (hereinafter, written as "PEDOT:PSS"), and copper phthalocyanine (hereinafter, written as "CuPc").

The inorganic semiconductors are p-type semiconductors. Examples of the inorganic semiconductors include $Cu_2O$, $CuGaO_2$, CuSCN, CuI, $NiO_x$, $MoO_x$, $V_2O_5$, and carbon materials such as graphene oxide.

The hole transport layer 6 may include a plurality of layers formed of different materials from one another.

The thickness of the hole transport layer 6 is desirably greater than or equal to 1 nm and less than or equal to 1000 nm, more desirably greater than or equal to 10 nm and less than or equal to 500 nm, and further desirably greater than or equal to 10 nm and less than or equal to 50 nm. When the thickness of the hole transport layer 6 is greater than or equal to 1 nm and less than or equal to 1000 nm, sufficient hole transport properties can be exhibited. When the thickness of the hole transport layer 6 is greater than or equal to 1 nm and less than or equal to 1000 nm, the hole transport layer 6 has a low resistance and allows light to be converted into electricity with high efficiency.

The hole transport layer 6 may include a supporting electrolyte and a solvent. The supporting electrolyte and the solvent may stabilize holes in the hole transport layer 6.

Examples of the supporting electrolytes include ammonium salts and alkali metal salts. Examples of the ammonium salts include tetrabutylammonium perchlorate, tetraethylammonium hexafluorophosphate, imidazolium salt, and pyridinium salt. Examples of the alkali metal salts include $LiN(SO_2C_nF_{2n+1})_2$, $LiPF_6$, $LiBF_4$, lithium perchlorate, and potassium tetrafluoroborate.

The solvent contained in the hole transport layer 6 may have high ion conductivity. Examples of the solvents include aqueous solvents and organic solvents. From the point of view of stabilizing the solutes, the solvent may be an organic solvent. Examples of the organic solvents include heterocyclic compound solvents such as tert-butylpyridine, pyridine, and n-methylpyrrolidone.

The solvent that may be contained in the hole transport layer 6 may be an ionic liquid. An ionic liquid may be used alone or as a mixture with other solvent. An ionic liquid is advantageous because of its low volatility and high flame retardancy.

Examples of the ionic liquids include imidazolium compounds such as 1-ethyl-3-methylimidazolium tetracyanoborate, pyridine compounds, alicyclic amine compounds, aliphatic amine compounds, and azonium amine compounds.

For example, the hole transport layer 6 is formed by a coating method, a printing method, or a vapor deposition method. Examples of the coating methods include doctor blade methods, bar coating methods, spray methods, dip coating methods, and spin coating methods. Examples of the printing methods include screen printing methods. The hole transport layer 6 may be formed by spreading a mixture of materials, and subsequently pressing or heat-treating the film. When the hole transport layer 6 includes a low-molecular organic semiconductor or inorganic semiconductor, the hole transport layer 6 may be formed by a vacuum vapor deposition method.

(Second Electrode 7)

The second electrode 7 has conductivity.

When the solar cell 200 does not include the hole transport layer 6, the second electrode 7 has characteristics that block electrons moving from the photoelectric conversion layer 5 (hereinafter, such characteristics are written as "electron-blocking properties"). In this case, the second electrode 7 does not make an ohmic contact with the photoelectric conversion layer 5. In the present specification, the electron-blocking properties mean that the material allows only holes generated in the photoelectric conversion layer 5 to pass through the material, and does not allow for the passage of electrons. The Fermi energy level of the material having electron-blocking properties is lower than the energy level at the lower end of the conduction band of the photoelectric conversion layer 5. The Fermi energy level of the material having electron-blocking properties may be lower than the Fermi energy level of the photoelectric conversion layer 5. Examples of the materials having electron-blocking properties include platinum, gold, and carbon materials such as graphene.

When the solar cell 200 includes the hole transport layer 6 between the second electrode 7 and the photoelectric conversion layer 5, the second electrode 7 does not necessarily have electron-blocking properties. In this case, the second electrode 7 may be composed of a material capable of forming an ohmic contact with the photoelectric conversion layer 5.

(Description of Solar Cell 200)

For example, a solar cell 200 according to the first embodiment is fabricated as follows.

First, as a substrate 1, for example, a conductive substrate having an uneven structure and capable of functioning also as a first electrode 2 is provided. A second electron transport layer 3 is formed on the conductive substrate by, for example, a sputtering method or a spray pyrolysis method. A first electron transport layer 4 is formed on the second electron transport layer 3 by, for example, a spray method or an inkjet method. The first electron transport layer 4 may be formed using electron transport material particles and a binder. The formation of the first electron transport layer 4 is performed at a relatively low temperature of, for example, less than 300° C. For purposes such as to remove a surfactant attached to the particles, UV irradiation may be performed instead of the heat treatment. A photoelectric conversion layer 5 is formed on the first electron transport layer 4 by a coating process. The photoelectric conversion layer 5 may also be formed by a physical vapor deposition method, or a combination of a physical vapor deposition method and a coating process. A hole transport layer 6 is formed on the photoelectric conversion layer 5 by, for example, a coating process, a physical vapor deposition method, or a chemical vapor deposition method. Lastly, a second electrode 7 is formed on the hole transport layer 6 by a physical vapor deposition method. Examples of the coating processes include spin coating, spray coating, die coating, inkjetting, gravure coating, flexographic coating, and screen printing. Examples of the physical vapor deposition methods include sputtering. Examples of the chemical vapor deposition methods include vapor deposition using, for example, heat, light, or plasma.

Second Embodiment

Figure 4:
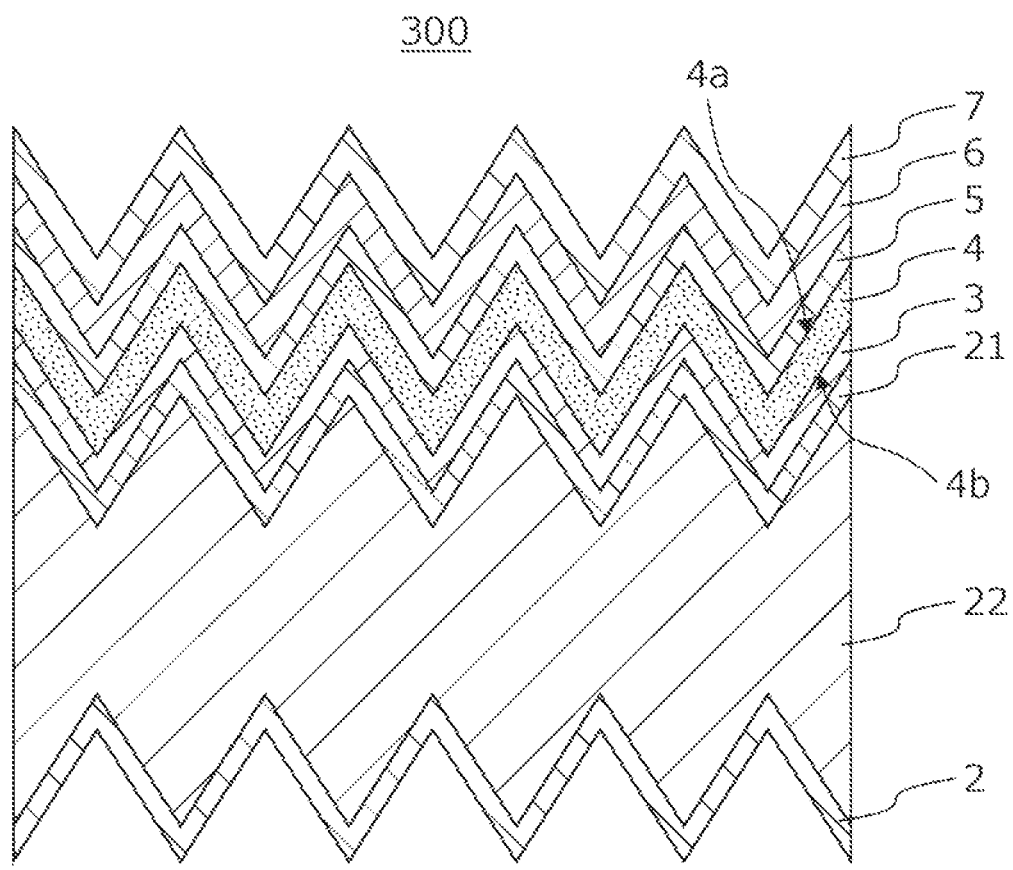
FIG. 4 illustrates a sectional view of a solar cell 300 according to the second embodiment.

FIG. 4 illustrates a sectional view of a solar cell 300 according to the second embodiment.

As illustrated in FIG. 4, the solar cell 300 according to the second embodiment differs from the solar cell 200 according to the first embodiment in that the substrate 1 is absent, and a recombination layer 21 and a second photoelectric conversion layer 22 are further provided between the first electrode 2 and the second electron transport layer 3. That is, the solar cell 300 is a stacked solar cell including two photoelectric conversion layers. The features described in the first embodiment will be omitted appropriately.

The second photoelectric conversion layer 22 is disposed between the recombination layer 21 and the first electrode 2.

The solar cell 300 includes the first electrode 2, the second photoelectric conversion layer 22, the recombination layer 21, the second electron transport layer 3, the first electron transport layer 4, the photoelectric conversion layer (the first photoelectric conversion layer) 5, the hole transport layer 6, and the second electrode 7 in this order.

Hereinafter, configurations that differ from those of the solar cell 200 will be described.

A layer having another function may be disposed between the first electrode 2 and the second photoelectric conversion layer 22. An example of the layer having another function is a porous layer.

(Recombination Layer 21)

For example, a recombination layer 21 is provided in the case of a stacked solar cell such as the solar cell 300. The recombination layer 21 functions to accept carriers generated in the first photoelectric conversion layer 5 and the second photoelectric conversion layer 22, thus allowing the carriers to recombine. It is therefore desirable that the recombination layer 21 have a certain degree of conductivity. For example, the recombination layer 21 may have translucency. Such a translucent recombination layer 21 may transmit light in the visible to near infrared region. The translucent recombination layer 21 may be formed from a transparent and conductive material.

Examples of such materials include:
(i) titanium oxides doped with at least one selected from the group consisting of lithium, magnesium, niobium, and fluorine;
(ii) gallium oxides doped with at least one selected from the group consisting of tin, and silicon;
(iii) gallium nitrides doped with at least one selected from the group consisting of silicon, and oxygen;
(iv) indium-tin composite oxides;
(v) tin oxides doped with at least one selected from the group consisting of antimony, and fluorine;
(vi) zinc oxides doped with at least one selected from the group consisting of boron, aluminum, gallium, and indium; and
(vii) composites of the above materials.

Examples of the materials of the recombination layers 21 include metal oxides such as ZnO, $WO_3$, $MoO_3$ and $MoO_2$, and electron-accepting organic compounds. Examples of the electron-accepting organic compounds include organic compounds having a CN group as a substituent. Examples of the organic compounds having a CN group as a substituent include triphenylene derivatives, tetracyanoquinodimethane derivatives, and indenofluorene derivatives. Examples of the triphenylene derivatives include hexacyanohexaazatriphenylene. Examples of the tetracyanoquinodimethane derivatives include tetrafluoroquinodimethane and dicyanoquinodimethane. The electron-accepting material may be a single compound or may be a mixture with other organic compound.

(Second Photoelectric Conversion Layer 22)

The photoelectric conversion material forming the second photoelectric conversion layer 22 has a bandgap smaller than that of the photoelectric conversion material forming the first photoelectric conversion layer 5. Examples of the photoelectric conversion materials for forming the second photoelectric conversion layer 22 include silicon, perovskite-type compounds, chalcopyrite-type compounds such as CIGS, and III-V group compounds such as GaAs. The second photoelectric conversion layer 22 may contain silicon. When the second photoelectric conversion layer 22 contains silicon, the solar cell 300 is a stacked solar cell in which a silicon solar cell and a perovskite solar cell are stacked together. However, the configuration is not limited thereto as long as the photoelectric conversion material forming the second photoelectric conversion layer 22 has a bandgap smaller than that of the photoelectric conversion material forming the first photoelectric conversion layer 5.

(Action and Effects of Solar Cell 300)

A basic action and effects of the solar cell 300 will be described. In the solar cell 300, at least one selected from the group consisting of the first electrode 2 and the second electrode 7 has translucency. When the second electrode 7 in the solar cell 300 has translucency, for example, light enters the solar cell 300 from the surface of the second electrode 7. When light reaches the solar cell 300, the first photoelectric conversion layer 5 absorbs the light and generates excited electrons and holes. The excited electrons move to the first electron transport layer 4 and the second electron transport layer 3. On the other hand, the holes generated in the first photoelectric conversion layer 5 move to the hole transport layer 6. Furthermore, the portion of light not absorbed by the first photoelectric conversion layer 5 passes through the first electron transport layer 4, the second electron transport layer 3, and the recombination layer 21, and is absorbed by the second photoelectric conversion layer 22. The second photoelectric conversion layer 22 absorbs the light and generates excited electrons and holes. The excited electrons move to the first electrode 2. On the other hand, the holes generated in the second photoelectric conversion layer 22 move to the recombination layer 21. The electrons that have moved from the first photoelectric conversion layer 5 to the recombination layer 21, and the holes that have moved from the second photoelectric conversion layer 22 to the recombination layer 21 recombine in the recombination layer 21. Current is taken out from the first electrode 2 and the second electrode 7 that function as the negative electrode and the positive electrode, respectively.

(Exemplary Method for Producing Solar Cell 300)

For example, the solar cell 300 may be fabricated by the following method. The following method illustrates an example in which the second photoelectric conversion layer 22 is composed of silicon.

First, a second photoelectric conversion layer 22 is provided that has an uneven structure and is composed of, for example, an n-type silicon single crystal. Subsequently, a first electrode 2 is formed on one of the main surfaces of the second photoelectric conversion layer 22 by a method such as a coating process, a physical vapor deposition method or a chemical vapor deposition method. A recombination layer 21 is formed on the other main surface of the second photoelectric conversion layer 22 by a physical vapor deposition method or a thermal vacuum vapor deposition method. Furthermore, a second electron transport layer 3 and a first electron transport layer 4 are formed on the recombination layer 21. A first photoelectric conversion layer 5 is formed on the first electron transport layer 4 by a coating process. The first photoelectric conversion layer 5 may also be formed by a physical vapor deposition method, or a combination of a physical vapor deposition method and a coating process. A hole transport layer 6 is formed on the first photoelectric conversion layer 5 by a method such as a coating process, a physical vapor deposition method or a chemical vapor deposition method. Lastly, a second electrode 7 is formed on the hole transport layer 6 by a physical vapor deposition method. Examples of the coating processes include spin coating, spray coating, die coating, inkjetting, gravure coating, flexographic coating, and screen printing.

Examples of the physical vapor deposition methods include sputtering. Examples of the chemical vapor deposition methods include vapor deposition using, for example, heat, light, or plasma.

The solar cell 300 according to the second embodiment includes two photoelectric conversion layers. That is, the solar cell 300 is a bilayer stacked solar cell in which two solar cells are joined together. However, the number of solar cells that are joined together is not limited to 2, and 3 or more solar cells may be coupled to one another.

Third Embodiment

An embodiment of a photoelectric conversion element of the present disclosure will be described.

A photoelectric conversion element according to the third embodiment includes:
a first electrode;
a first electron transport layer;
a second electron transport layer;
a photoelectric conversion layer; and
a second electrode,
wherein
the photoelectric conversion layer is disposed between the first electrode and the second electrode,
the first electron transport layer is disposed between the photoelectric conversion layer and the first electrode,
the second electron transport layer is disposed between the first electron transport layer and the first electrode, and
the first electron transport layer includes carbon and a porous electron transport material.

For example, the photoelectric conversion element according to the third embodiment is an optical sensor. For example, the photoelectric conversion element according to the third embodiment may function as an optical sensor by being connected to a current detector through wires to the first electrode and the second electrode. The current detector may be a known current detector.

In the photoelectric conversion element according to the third embodiment, the first electrode may have an uneven structure as is the case in the solar cell 200 according to the first embodiment. The photoelectric conversion layer can be formed so as to cover the entire surface of the base with a substantially uniform film thickness even when the base has an uneven structure. As a result, the photoelectric conversion element that is obtained is highly reliable and has a low risk of problems such as a short circuit at a protrudent top portion.

EXAMPLES

Example 1

Figure 5:
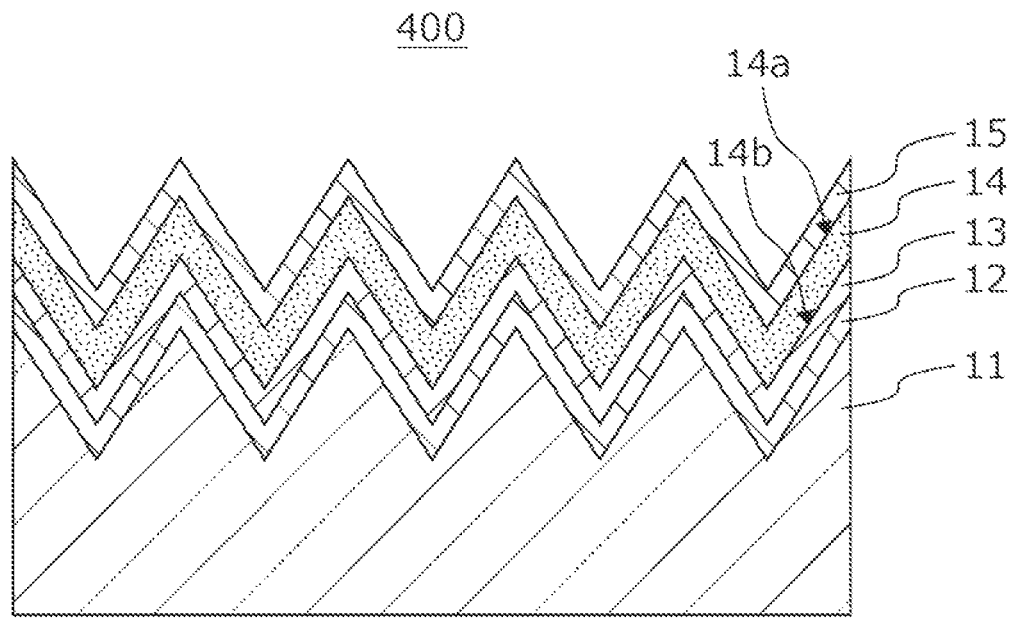
FIG. 5 illustrates a sectional view of a photoelectric conversion layer-bearing substrate 400 according to EXAMPLE 1.

FIG. 5 illustrates a sectional view of a photoelectric conversion layer-bearing substrate 400 according to EXAMPLE 1. As illustrated in FIG. 5, the photoelectric conversion layer-bearing substrate 400 according to EXAMPLE 1 includes a substrate 11, a first electrode 12, a second electron transport layer 13, a first electron transport layer 14, and a photoelectric conversion layer 15. The substrate 11, the first electrode 12, the second electron transport layer 13, the first electron transport layer 14, and the photoelectric conversion layer 15 in the photoelectric conversion layer-bearing substrate 400 correspond to the substrate 1, the first electrode 2, the second electron transport layer 3, the first electron transport layer 4, and the photoelectric conversion layer 5 in the solar cell 100 and the solar cell 200 according to the first embodiment, respectively.

The members constituting the photoelectric conversion layer-bearing substrate 400 of EXAMPLE 1 are as follows.
Substrate 11: Silicon substrate with a textured structure. (The average height difference is 2.0 μm, that is, the average of the height differences between a top portion and a valley portion on the textured surface is 2.0 μm.)
First electrode 12: Tin-doped indium oxide layer (thickness: 100 nm).
Second electron transport layer 13: $TiO_2$ layer (thickness: 15 nm).
First electron transport layer 14: Porous $TiO_2$ layer (thickness: 150 nm).
Photoelectric conversion layer 15: Layer principally including perovskite compound $CH(NH_2)PbI_3$.

The fabrication method is described in detail below.
First, a silicon substrate having a tin-doped indium oxide layer on the surface was provided. This substrate served as a substrate 11 and a first electrode 12. The silicon substrate has an uneven textured structure having an average height difference of 2.0 μm.
Next, a 15 nm thick $TiO_2$ film was formed as a second electron transport layer 13 on the first electrode 12 by sputtering.
Next, the second electron transport layer 13 was heated to 150° C. on a heater-equipped stage, and a first feedstock solution was applied by an inkjet method.
Subsequently, the surface was cleaned by UV ozone treatment at room temperature. A first electron transport layer 14 was thus formed. The first feedstock solution was a butanol (manufactured by Wako Pure Chemical Industries, Ltd.) dispersion containing 15 g/L of 30-NR-D (manufactured by GreatCell Solar).
Next, a second feedstock solution was applied onto the first electron transport layer 14 by a spin coating method to form a photoelectric conversion layer 15. The second feedstock solution was a dimethyl sulfoxide (manufactured by Acros) and N,N-dimethylformamide (manufactured by Across) solution containing 0.92 mol/L of $PbI_2$ (manufactured by Tokyo Chemical Industry Co., Ltd.), 0.17 mol/L of PbBr2 (manufactured by Tokyo Chemical Industry Co., Ltd.), 0.83 mol/L of formamidinium iodide (manufactured by GreatCell Solar) (hereinafter, written as "FAI"), 0.17 mol/L of methylammonium bromide (manufactured by Great-Cell Solar) (hereinafter, written as "MABr"), and 0.05 mol/L of CsI (manufactured by Iwatani Corporation). The mixing ratio of dimethyl sulfoxide to N,N-dimethylformamide in the second feedstock solution was 1:4 (by volume).

A photoelectric conversion layer-bearing substrate 400 of EXAMPLE 1 was thus obtained.

The steps described above, except the step of providing the first electrode 12, were carried out in a dry room under a dry atmosphere having a dew point of less than or equal to −40° C.

Comparative Example 1

A photoelectric conversion layer-bearing substrate 500 of COMPARATIVE EXAMPLE 1 was fabricated in the same manner as in EXAMPLE 1 except for the following. In the formation of a first electron transport layer 14, the second electron transport layer 13 was heated to 150° C. on a heater-equipped stage. Next, the first feedstock solution was applied by an inkjet method, followed by heat-treatment in an oven at 500° C. for 30 minutes. Subsequently, the surface was cleaned by UV ozone treatment at room temperature to form a first electron transport layer 14. These points are the differences from EXAMPLE 1.

(TOF-SIMS)

When the step of forming the first electron transport layer 14 in EXAMPLE 1 completed, the substrate was analyzed by mass spectrometry with TOF.SIMS 5 (manufactured by ION-TOF) in the depth direction. The measurement conditions were primary ion $Bi^{3+}$ (acceleration voltage: 30 kV), sputtering ion $Cs^+$ (acceleration voltage: 1 kV), detected secondary ion polarity: negative, and analysis area: 80 µm×80 µm.

Figure 6:
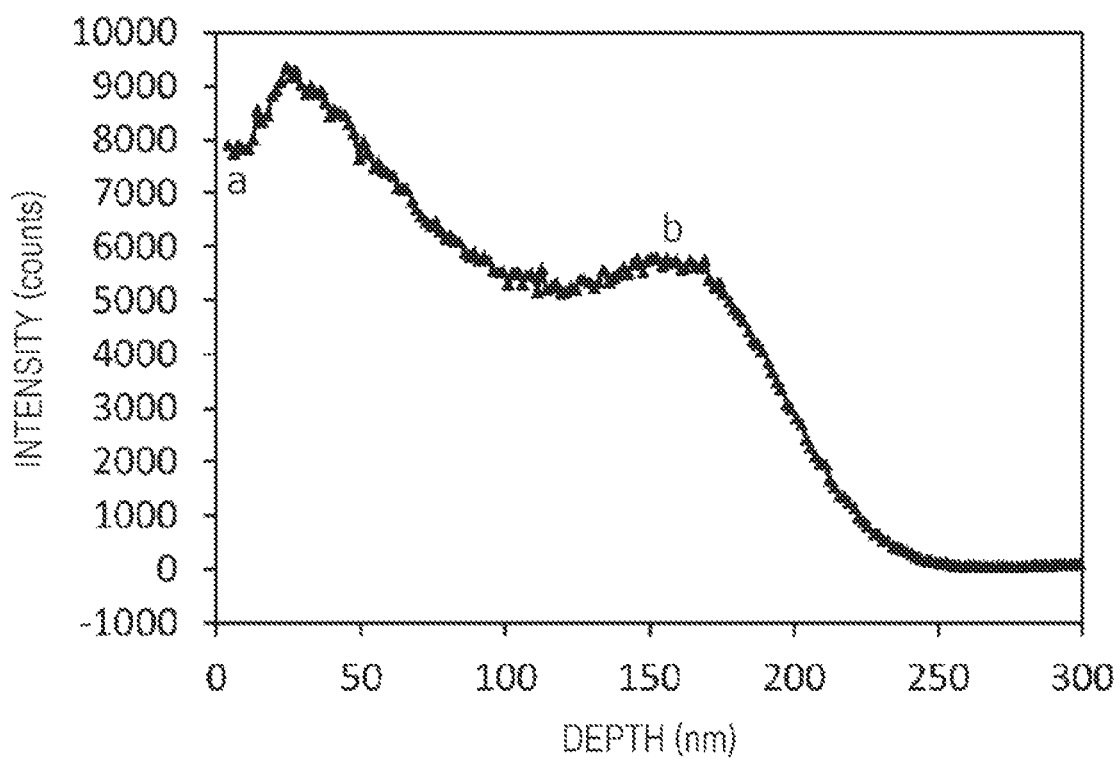
FIG. 6 is a graph illustrating a carbon profile obtained by time-of-flight secondary ion mass spectrometry of a first electron transport layer of EXAMPLE 1.

FIG. 6 is a graph illustrating a carbon profile obtained by TOF-SIMS of the first electron transport layer 14 of EXAMPLE 1. The structure of the carbon profile had peaks. In EXAMPLE 1, a sufficient amount of carbon was present on the second main surface 14b of the first electron transport layer 14.

(Diagram of Relationship Between Carbon Threshold and Power Generation Efficiency)

Based on the profile, revealed by TOF-SIMS, of carbon contained in the first electron transport layer 14, the ratio of the second carbon intensity (b) of the second main surface 14b of the first electron transport layer 14 to the first carbon intensity (a) of the first main surface 14a of the first electron transport layer 14 is defined as the carbon threshold. Specifically:

(Carbon threshold)=(Intensity b)/(Intensity a). The present inventors have found that the intensity a is constant in the measurement of carbon profiles by TOF-SIMS. Surface analysis by X-ray photoelectron spectroscopy (XPS) described later also confirmed that the carbon concentration at the first main surface 14a of the first electron transport layer 14 was constant.

Figure 7A:
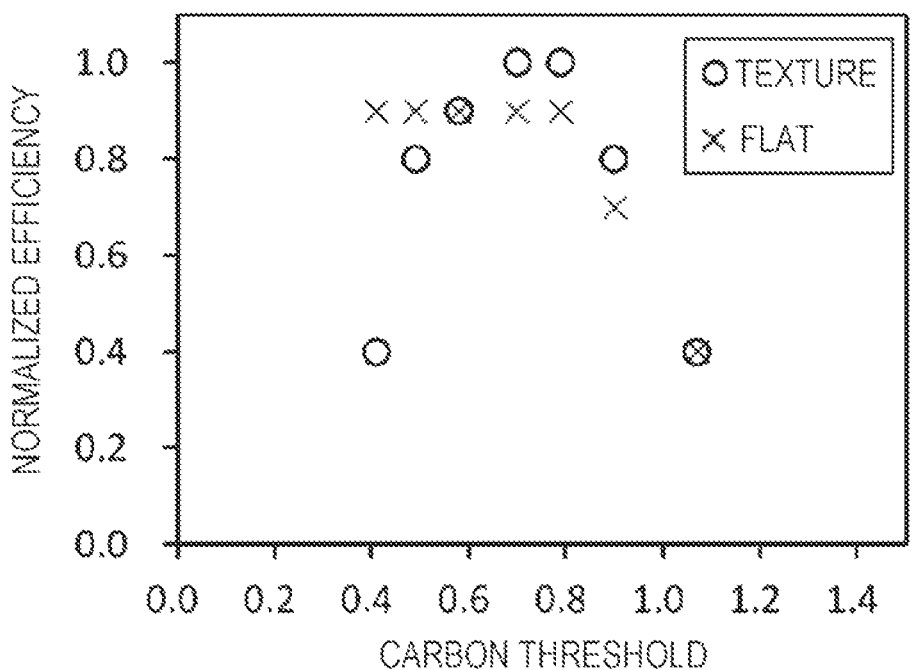
FIG. 7A is a graph illustrating relationships estimated between the carbon threshold and the normalized efficiency with respect to solar cells fabricated on a flat substrate or a textured substrate having an uneven structure on the surface.

FIG. 7A is a graph illustrating a relationship estimated between the carbon threshold and the normalized efficiency with respect to solar cells fabricated on a textured substrate having an uneven structure on the surface. The present inventors have found that a normalized efficiency of greater than or equal to 0.4 is obtained when the carbon threshold is greater than or equal to 0.41 and less than or equal to 1.07. The present inventors have also found that a normalized efficiency of greater than or equal to 0.8 is obtained when the carbon threshold is greater than or equal to 0.49 and less than or equal to 0.90.

Figure 7B:
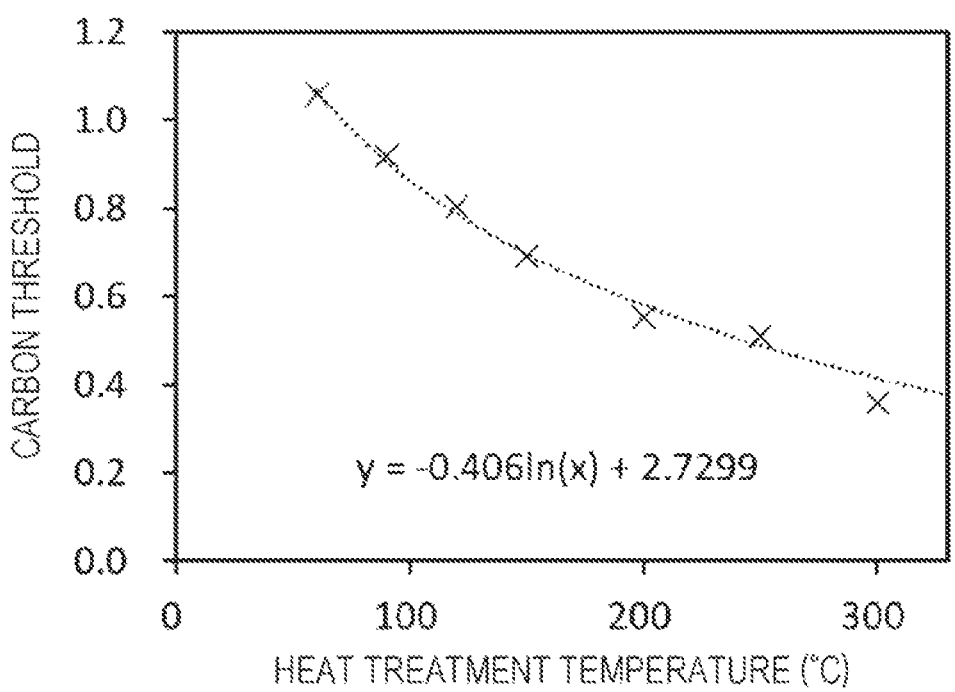
FIG. 7B is a graph illustrating a relationship between the heat treatment temperature and the carbon threshold.
Figure 9:
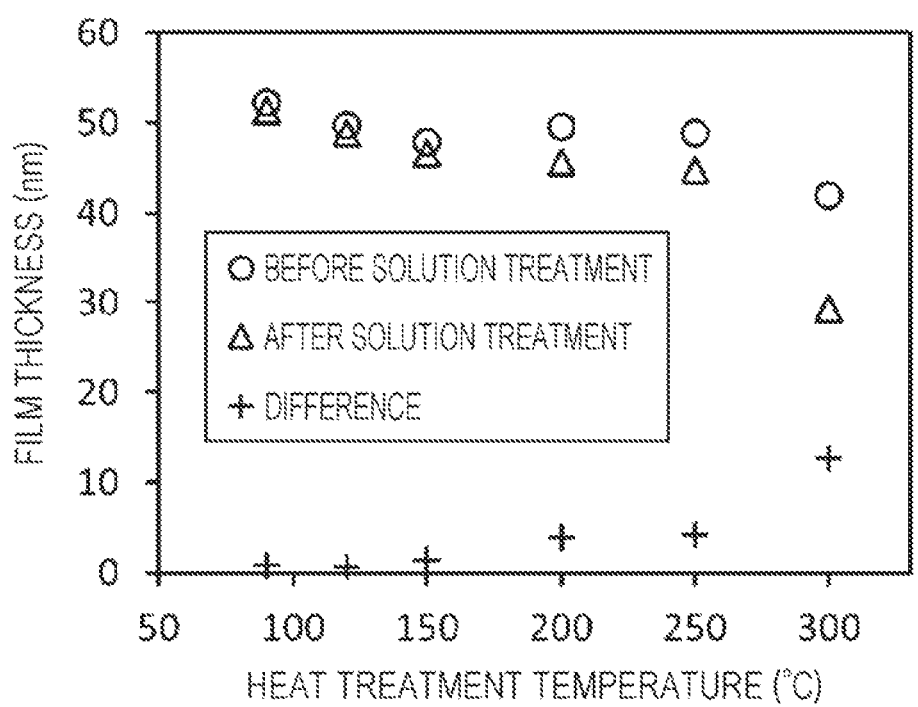
FIG. 9 is a graph illustrating the dependence of film thickness on heat treatment temperature, determined by heat-treating a first electron transport layer formed on a flat substrate and comparing the film thickness before and after spin-coating of a solvent.

In preparing the graph illustrated in FIG. 7A, an experiment was performed to determine the relationship between the carbon threshold and the change in thickness of the porous body in the first electron transport layer 14. While the details will be described later, as illustrated in FIG. 9, the difference in film thickness, caused by washing, of the first electron transport layer 14 after 60° C. to 300° C. is, in the first approximation, proportional to the amount of a binder attached to the surface of the first electron transport layer 14, that is, the carbon threshold. From the carbon profile of EXAMPLE 1 illustrated in FIG. 6, the carbon threshold at 150° C. is estimated to be 0.70. FIG. 7B is a graph illustrating a relationship between the heat treatment temperature and the carbon threshold.

FIG. 7A and FIGS. 10A to 10D illustrate performances of solar cells fabricated on a flat substrate at various heat treatment temperatures. At a carbon threshold exceeding 0.90 in FIG. 7A, the efficiency may be decreased because the thickness of the first electron transport layer 14 is large.

In the textured cells, separation stemming from binder shortage may occur when the carbon threshold is low, specifically, below 0.41.

When the perovskite material includes carbon such as organic molecules, the carbon threshold of the first electron transport layer 14 is measured after the perovskite is dissolved and removed.

(XPS)

Figure 8:
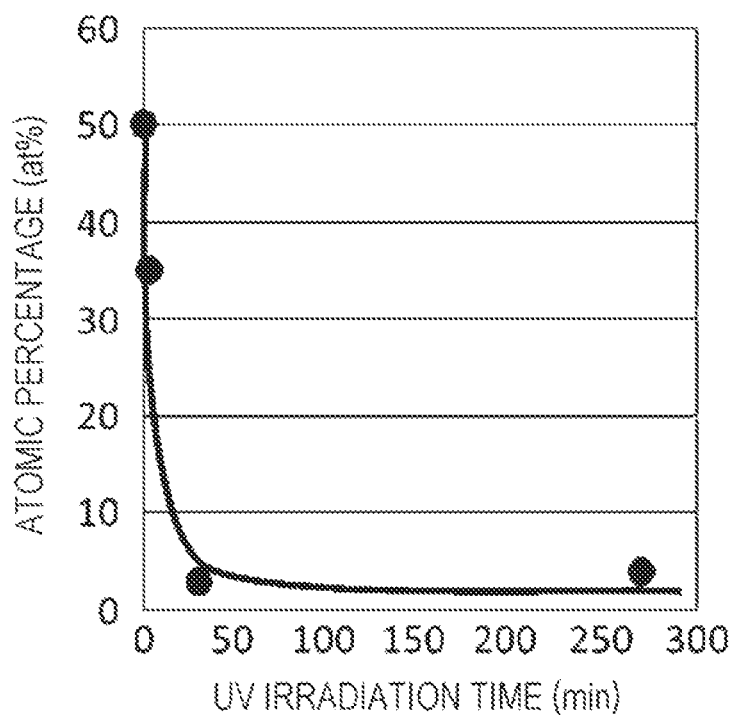
FIG. 8 is a graph illustrating the dependence of C—C bond peak intensity on UV irradiation time, obtained from the intensity change in a C1s spectrum according to X-ray photoelectron spectroscopy for the first electron transport layer of EXAMPLE 1.

When the step of forming the first electron transport layer 14 in EXAMPLE 1 completed, the surface of the substrate 400 was analyzed by XPS. The dependence of C—C bond peak intensity on UV irradiation time was measured based on the intensity change in the C1s spectrum. FIG. 8 is a graph illustrating the dependence of C—C bond peak intensity on UV irradiation time, obtained from the intensity change in the C1s spectrum according to XPS for the first electron transport layer 14 of EXAMPLE 1. In EXAMPLE 1, the C concentration was lowered to a level of the intensity in COMPARATIVE EXAMPLE 1 after 30 minutes of irradiation, the time in which the surface cleaning was completed. It was confirmed that the carbon content on the first main surface 14a of the first electron transport layer 14 converges to a constant value after the UV ozone cleaning step required for the formation of the photoelectric conversion layer 5.

(Estimation of Relationship Between Carbon Threshold and Power Generation Efficiency)

Regarding the carbon threshold of EXAMPLE 1 obtained by TOF-SIMS, the relationship between the power generation efficiency and the carbon threshold was complemented. A first electron transport layer 14 was formed on a flat substrate, heat-treated in an oven at a predetermined temperature for 30 minutes, and spin-coated with a solvent for a photoelectric conversion layer 15 containing no perovskite material to determine the dependence of residual film thickness of the first electron transport layer 14 on heat treatment temperature. FIG. 9 is a graph illustrating the dependence of film thickness on heat treatment temperature, determined by heat-treating the first electron transport layer 14 formed on the flat substrate and comparing the film thickness before and after spin-coating of the solvent. The fixation force of the first electron transport layer 14 decreases, and the loss of film thickness (the difference in the drawing) increases at the boundary between 250° C. and 300° C.

Table 1 describes the results of first approximation of the relationship between the temperature dependence of the difference in film thickness, and the carbon threshold at 60° C. to 300° C. according to the TOF-SIMS carbon profile measurement, in correspondence with the temperature dependence.

TABLE 1

| Heat-treatment temperature (° C.) | Carbon threshold |
| --- | --- |
| 60 | 1.07 |
| 90 | 0.90 |
| 120 | 0.79 |
| 150 (EXAMPLE 1) | 0.70 |
| 200 | 0.58 |
| 250 | 0.49 |
| 300 | 0.41 |

Furthermore, perovskite solar cells were fabricated using the first electron transport layer 14 formed at each of the above temperatures, and power generation performances were compared. The fabrication procedure was as follows.

(Fabrication Procedure)

A feedstock solution for forming a photoelectric conversion layer was a dimethyl sulfoxide (manufactured by Acros) and N,N-dimethylformamide (manufactured by Acros) solution containing 0.92 mol/L of $PbI_2$ (manufactured by Tokyo Chemical Industry Co., Ltd.), 0.17 mol/L of PbBr2 (manufactured by Tokyo Chemical Industry Co., Ltd.), 0.83 mol/L of FAI (manufactured by GreatCell Solar), 0.17 mol/L of MABr (manufactured by GreatCell Solar), and 0.05 mol/L of CsI (manufactured by Iwatani Corporation). The mixing ratio of dimethyl sulfoxide to N,N-dimethylformamide was 1:4 (by volume).

The feedstock solution was applied onto the first electron transport layer 14 by a spin coating method. Here, 200 μL of chlorobenzene as a poor solvent was dropped onto the substrate being rotated.

Subsequently, the substrate was heat-treated on a hot plate at 115° C. for 10 minutes and was further heat-treated on a hot plate at 100° C. for 30 minutes. Thus, a photoelectric conversion layer having a thickness of 500 nm was formed on the first electron transport layer 14.

Subsequently, a toluene solution of polytriarylamine (PTAA, manufactured by Sigma-Aldrich) as a hole transport layer was spin-coated onto the photoelectric conversion layer to form a hole transport layer having a thickness of 40 nm.

Subsequently, a Au film having a thickness of 170 nm was deposited onto the hole transport layer to form a second electrode. A perovskite solar cell was thus obtained.

(Evaluation of Power Generation Performances)

Figure 10A:
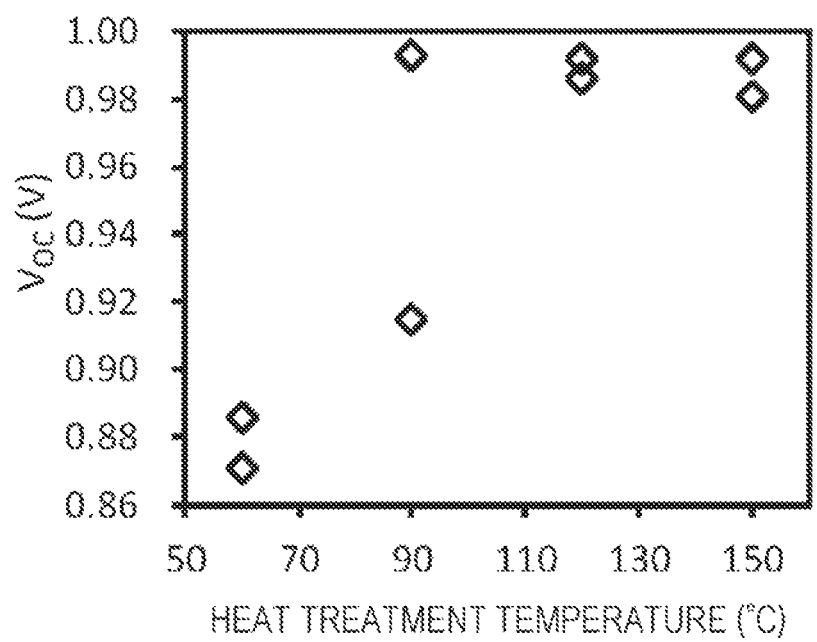
FIG. 10A is a graph illustrating the dependence of open-circuit voltage on heat treatment temperature of solar cells fabricated using a flat substrate after a first electron transport layer disposed on the substrate has been heat-treated.
Figure 10B:
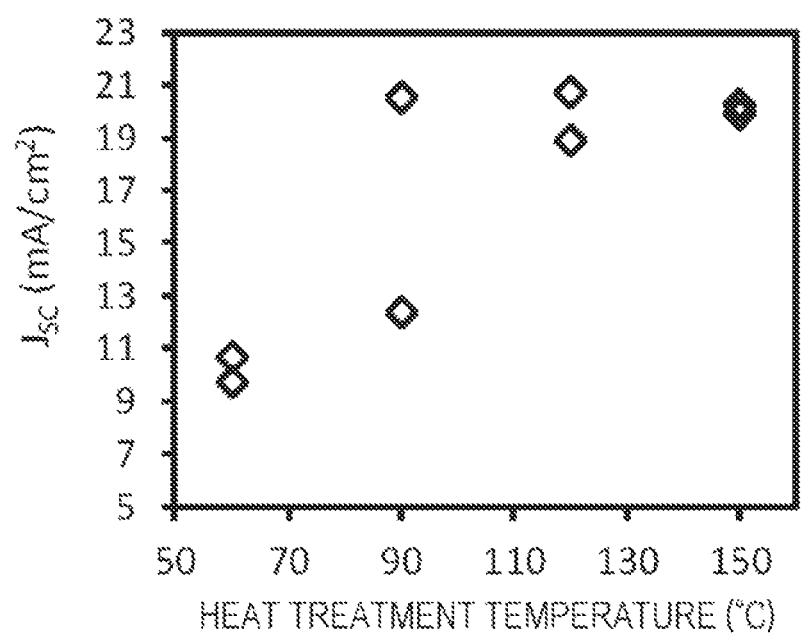
FIG. 10B is a graph illustrating the dependence of short-circuit current density on heat treatment temperature of solar cells fabricated using a flat substrate after a first electron transport layer disposed on the substrate has been heat-treated.
Figure 10C:
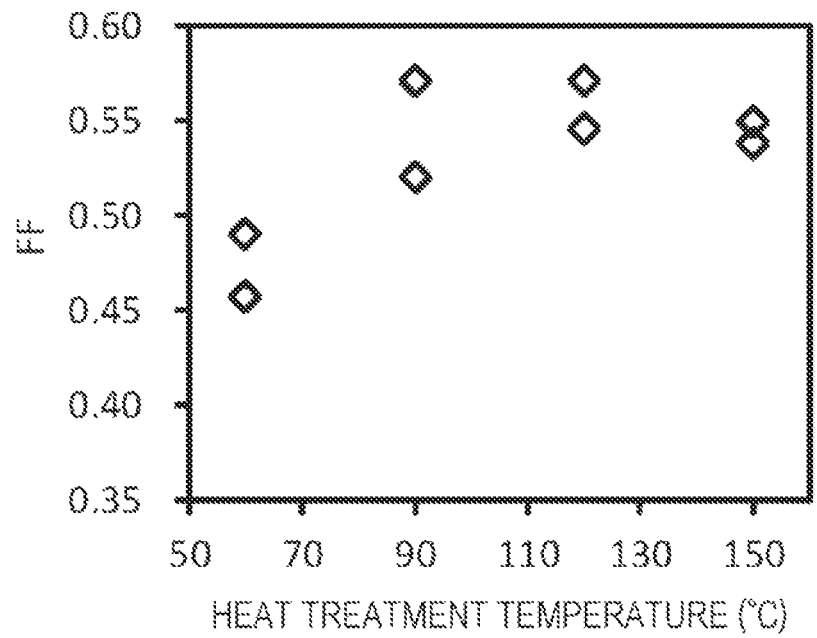
FIG. 10C is a graph illustrating the dependence of fill factor on heat treatment temperature of solar cells fabricated using a flat substrate after a first electron transport layer disposed on the substrate has been heat-treated.
Figure 10D:
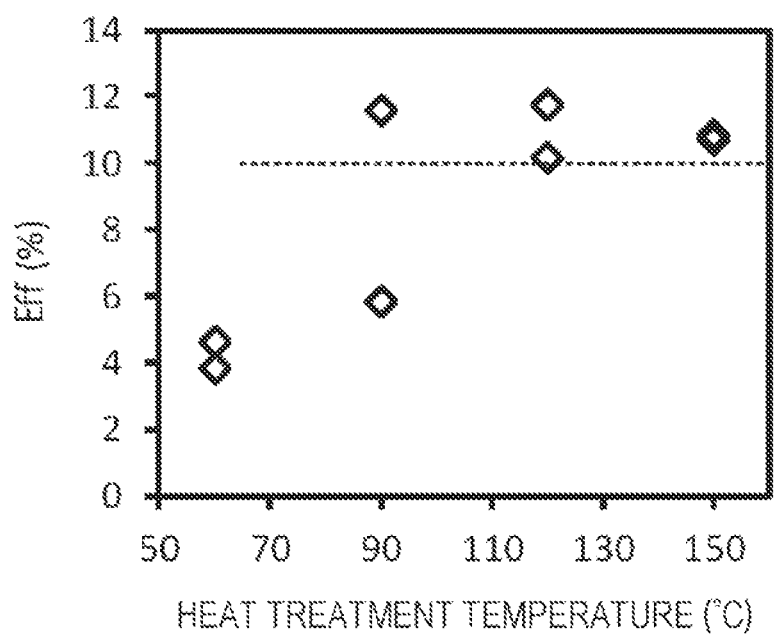
FIG. 10D is a graph illustrating the dependence of conversion efficiency on heat treatment temperature of solar cells fabricated using a flat substrate after a first electron transport layer disposed on the substrate has been heat-treated.
Figure 11A:
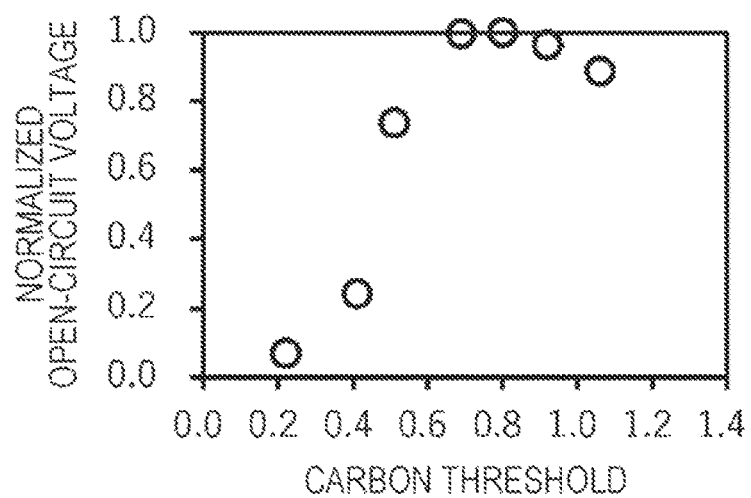
FIG. 11A is a graph illustrating the results of estimating the solar cell performance while converting the abscissa of FIG. 10A to the carbon threshold and also in consideration of a short circuit between layers occurring in a low carbon threshold region.
Figure 11B:
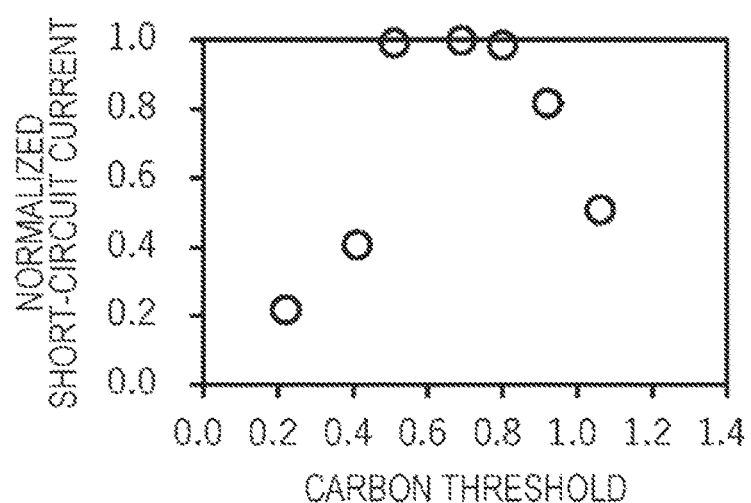
FIG. 11B is a graph illustrating the results of estimating the solar cell performance while converting the abscissa of FIG. 10B to the carbon threshold and also in consideration of a short circuit between layers occurring in a low carbon threshold region.
Figure 11C:
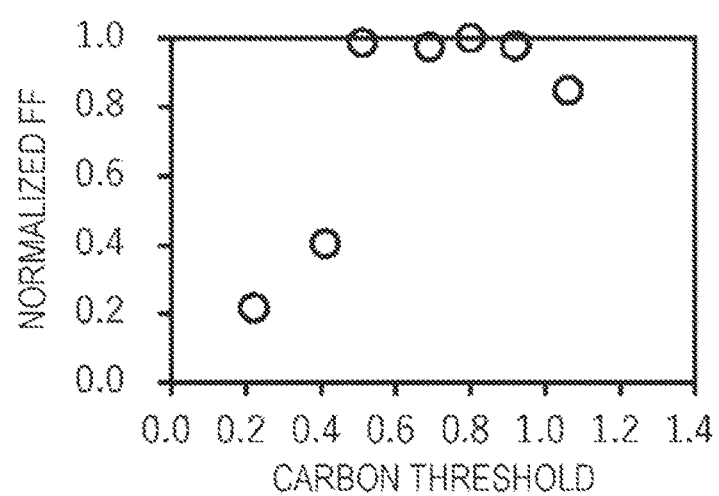
FIG. 11C is a graph illustrating the results of estimating the solar cell performance while converting the abscissa of FIG. 10C to the carbon threshold and also in consideration of a short circuit between layers occurring in a low carbon threshold region.

FIG. 10A is a graph illustrating the dependence of open-circuit voltage on heat treatment temperature of the solar cells fabricated using the flat substrate after the first electron transport layer 14 disposed on the substrate was heat-treated. FIG. 10B is a graph illustrating the dependence of short-circuit current density on heat treatment temperature of the solar cells fabricated using the flat substrate after the first electron transport layer 14 disposed on the substrate was heat-treated. FIG. 10C is a graph illustrating the dependence of fill factor on heat treatment temperature of the solar cells fabricated using the flat substrate after the first electron transport layer 14 disposed on the substrate was heat-treated. FIG. 10D is a graph illustrating the dependence of conversion efficiency on heat treatment temperature of the solar cells fabricated using the flat substrate after the first electron transport layer 14 disposed on the substrate was heat-treated. In FIG. 10A, the open-circuit voltage is indicated by $V_{oc}$. In FIG. 10B, the short-circuit current density is indicated by $J_{sc}$. In FIG. 10C, the fill factor is indicated by FF. In FIG. 10D, the conversion efficiency is indicated by Eff. It was revealed that the carbon threshold was large at a low heat treatment temperature, and carbon inhibited the transport of electrons generated in the photoelectric conversion layer. FIG. 11A is a graph illustrating the results of estimating the solar cell performance while converting the abscissa of FIG. 10A to the carbon threshold and also in consideration of a short circuit between layers occurring in a low carbon threshold region. FIG. 11B is a graph illustrating the results of estimating the solar cell performance while converting the abscissa of FIG. 10B to the carbon threshold and also in consideration of a short circuit between layers occurring in a low carbon threshold region. FIG. 11C is a graph illustrating the results of estimating the solar cell performance while converting the abscissa of FIG. 10C to the carbon threshold and also in consideration of a short circuit between layers occurring in a low carbon threshold region.

The above results are summarized in Tables 2 and 3. Table 2 describes the power generation efficiency of the solar cells on the textured substrate. Table 3 describes the power generation efficiency of the solar cells on the flat substrate. The power generation efficiency of a solar cell fabricated on a uniform film under the conditions of EXAMPLE 1 was normalized to 1.

TABLE 2

| Carbon threshold | Power generation efficiency (textured substrate) |
| --- | --- |
| 1.07 | 0.4 |
| 0.90 | 0.8 |
| 0.79 | 1 |
| 0.70 | 1 |
| 0.58 | 0.9 |
| 0.49 | 0.8 |
| 0.41 | 0.4 |
| 0 | 0 |

TABLE 3

| Carbon threshold | Power generation efficiency (flat substrate) |
| --- | --- |
| 1.07 | 0.4 |
| 0.90 | 0.7 |
| 0.79 | 0.9 |
| 0.70 | 0.9 |
| 0.58 | 0.9 |
| 0.49 | 0.9 |
| 0.41 | 0.9 |

When the carbon threshold is greater than or equal to 0.41, the first electron transport layer 14 exhibits a sufficient fixation force. When the carbon threshold is less than or equal to 1.07, carbon does not inhibit the electron transport and it is possible to prevent decrease in open-circuit voltage, short-circuit current density and fill factor. The flat cells achieve higher cell efficiency when the carbon threshold is greater than or equal to 0.41 and less than or equal to 0.90. The textured cells attain higher cell efficiency when the carbon threshold is greater than or equal to 0.49 and less than or equal to 0.90.

The solar cell of the present disclosure may be used in various applications including the applications of conventional solar cells.

What is claimed is:

1. A solar cell, comprising:
   a first electrode;
   a first electron transport layer;
   a second electron transport layer;
   a photoelectric conversion layer; and
   a second electrode,
   wherein
   the photoelectric conversion layer is disposed between the first electrode and the second electrode,
   the first electron transport layer is disposed between the photoelectric conversion layer and the first electrode,
   the second electron transport layer is disposed between the first electron transport layer and the first electrode,
   the first electron transport layer includes carbon and a porous electron transport material,
   the first electron transport layer includes a first main surface facing the photoelectric conversion layer, and a second main surface facing the second electron transport layer, and
   in the first electron transport layer, a ratio of a second carbon intensity according to time-of-flight secondary ion mass spectrometry on the second main surface to a first carbon intensity according to time-of-flight secondary ion mass spectrometry on the first main surface is greater than or equal to 0.41 and less than or equal to 1.07.

2. The solar cell according to claim 1, wherein the ratio is greater than or equal to 0.49 and less than or equal to 0.90.

3. The solar cell according to claim 1, wherein the carbon originates from a binder or a dispersant.

4. The solar cell according to claim 1, wherein the photoelectric conversion layer contains a perovskite compound.

5. The solar cell according to claim 1, wherein the porous electron transport material is titanium oxide.

6. The solar cell according to claim 1, wherein the first electrode has an uneven structure.

7. The solar cell according to claim 1, wherein the first electron transport layer is in contact with the second electron transport layer.

8. A photoelectric conversion element, comprising:
a first electrode;
a first electron transport layer;
a second electron transport layer;
a photoelectric conversion layer; and
a second electrode,
wherein
the photoelectric conversion layer is disposed between the first electrode and the second electrode,
the first electron transport layer is disposed between the photoelectric conversion layer and the first electrode,
the second electron transport layer is disposed between the first electron transport layer and the first electrode,
the first electron transport layer includes carbon and a porous electron transport material,
the first electron transport layer includes a first main surface facing the photoelectric conversion layer, and a second main surface facing the second electron transport layer, and
in the first electron transport layer, a ratio of a second carbon intensity according to time-of-flight secondary ion mass spectrometry on the second main surface to a first carbon intensity according to time-of-flight secondary ion mass spectrometry on the first main surface is greater than or equal to 0.41 and less than or equal to 1.07.

* * * * *